United States Patent [19]

Newman et al.

[11] Patent Number: 5,044,615
[45] Date of Patent: Sep. 3, 1991

[54] DUAL PURPOSE WORK BOARD HOLDER

[75] Inventors: Robert L. Newman, SE. Concord; Michael C. Weller; Frank P. Zickefoose, both of Charlotte, all of N.C.

[73] Assignee: International Business Machines Corporation, Armonk, N.Y.

[21] Appl. No.: 653,200

[22] Filed: Feb. 8, 1991

[51] Int. Cl.5 ............................................... B25B 1/08
[52] U.S. Cl. .................................... 269/231; 269/235; 269/903; 269/305
[58] Field of Search ............... 269/305, 231, 235, 903, 269/900, 43; 81/90

[56] References Cited

U.S. PATENT DOCUMENTS

| | | | |
|---|---|---|---|
| 3,473,420 | 10/1969 | Boggs | 269/235 |
| 3,680,193 | 8/1972 | Scaminaci et al. | 269/903 |
| 3,827,685 | 8/1974 | Wennes | 269/231 |
| 4,477,064 | 10/1984 | DiGiulio | 269/235 |
| 4,667,868 | 5/1987 | Decker . | |
| 4,703,920 | 11/1987 | Grabbe et al. | 269/403 |
| 4,730,237 | 3/1988 | Locker . | |
| 4,948,108 | 8/1990 | Sullivan . | |

Primary Examiner—Robert C. Watson
Attorney, Agent, or Firm—J. R. Hanway

[57] ABSTRACT

A printed circuit board holder wherein several boards are securely held in place in a fixture by force exerting devices pushing against the board edges. The fixture includes recessed openings where the boards are located and force exerting devices positioned between pairs of the openings. The force exerting devices include an elliptical member which is mounted flush with the boards and is rotatable to push the two adjacent boards apart from each other. Contact is made only with the board edges to provide a smooth surface across the force exerting means, the circuit boards, and the fixture.

11 Claims, 3 Drawing Sheets

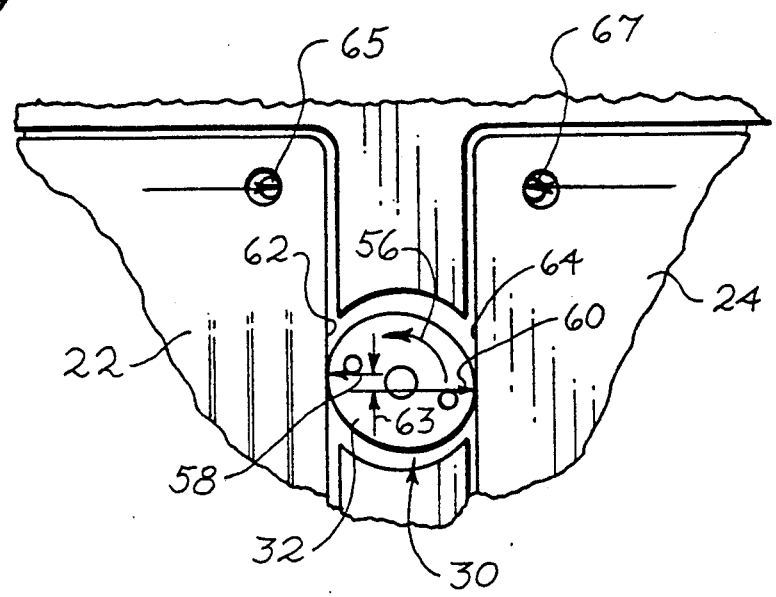
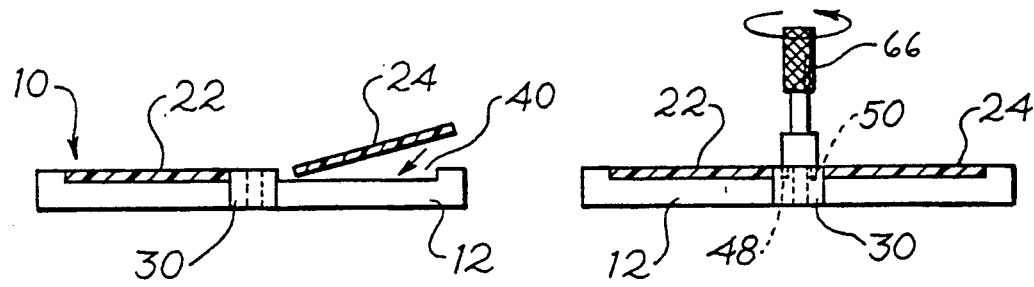
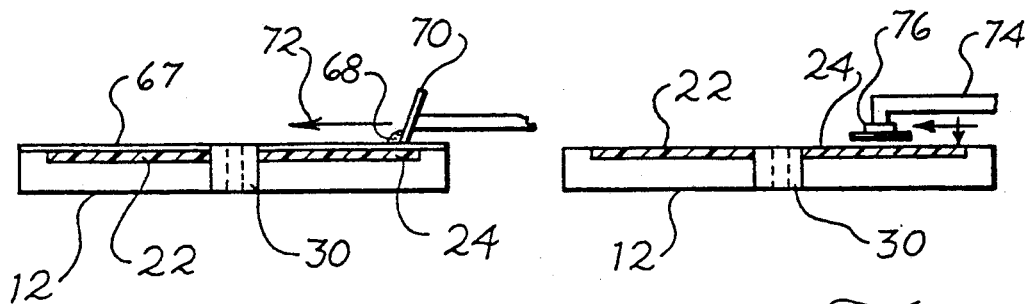

DUAL PURPOSE WORK BOARD HOLDER

BACKGROUND OF THE INVENTION

1. Field of the Invention

This invention relates, in general, to work holders for electrical circuit assemblages or wiring systems and. more specifically. to printed circuit board holders useful during the application of solder paste and components to the boards.

2. Description of the Prior Art

When manufacturing printed circuit boards (PCB's) for use in electronic equipment, the bare boards are frequently screened with a solder paste or cream to deposit the paste where the component leads will be soldered to the board. The paste is selectively applied only to the solder areas by the configuration or design of the screen. Once screened, a PCB is transported to another station or device which places the components onto the board at the proper locations. Next, the board with the components in place is transported to a soldering station. While these processes can be performed on single PCB's, one at a time, it is often desirable in high speed production to perform some or all of these processes on several boards at substantially the same time.

Work board holders have been used, according to the prior art, to hold or secure a plurality of boards in predetermined positions so that the various operations can be performed simultaneously on the boards. According to usual prior art practice, separate work board holders are used for paste screening and for component placement, since the physical requirements of the holders are different. For the screening process, the holder must secure the boards with clamps, clips, or other devices which do not appreciably extend above the surface of the board. Since the paste is applied with a smooth blade which wipes or moves across the screen and board, objects extending above the board can interfere with paste application and reduce the life of the screen and/or blade. However, the protrusion of locking tabs or clamps above the board surface is not of critical concern during component placement. Thus, it is conventional practice to use more positive and secure holding devices during component placement than when the boards are screened.

A prior art method of processing PCB's involved the use of a fixture having several openings or slots for placement of PCB's. The boards were held in place for the screening application of solder paste by thin clips which extended for a short distance over the surface of the boards. After screening, the boards were removed from that fixture and inserted into another fixture which firmly held the boards in place with locking tabs which extended above the surface of the boards. Even though this arrangement has been useful in processing several PCB's at a time, a considerable amount of time is needed to transfer the boards from the one holder or fixture to the other. In addition, the clips holding the boards during the screening operation, even though thin, can still cause difficulties with the screen member and with the life of the flux application blade.

Therefore, it is desirable, and an object of this invention, to provide a universal work board holder which is useful in screening and component placement operations during assembly operations involving printed circuit boards.

SUMMARY OF THE INVENTION

There is disclosed herein a new and useful printed circuit work board holder which is specifically constructed to simultaneously secure several printed circuit boards during multiple manufacturing operations. The holder uses flush mounted force exerting devices which contact only the edge of the printed circuit boards. The force exerting devices push adjacent pairs of the circuit boards away from each other to secure the boards in the openings of the fixture in which they are placed.

According to a specific embodiment of the invention, the force exerting devices use a non-circular, elliptical, rotating member which is positioned between pairs of printed circuit boards. This member is rotatable around an axis which is perpendicular to the plane containing the printed circuit boards. Rotation of the elliptical member causes the member to contact the edges of the boards and exert opposite forces in a co-planar direction against the board edges. These forces secure the boards in the openings of the fixture and allow for operations to be performed closely on or across the boards without obstruction from the securing devices. The elliptical member is mated to a circular member which extends through an opening in the fixture. The combination of the two members is allowed to rotate through the fixture opening to move the major or longer axis of the elliptical member more perpendicular to the edges of the printed circuit boards. This effectively spreads the boards apart and provides forces against the edges of the boards. The opening through the fixture is slightly larger than the corresponding surfaces of the force exerting member so that the force exerting member is floating within the opening and is allowed to move from one side to the other to compensate for changes in sizes of the printed circuit boards.

BRIEF DESCRIPTION OF THE DRAWINGS

Further advantages and uses of this invention will become more apparent when considered in view of the following detailed description and drawings, in which:

FIG. 5 is a top view of a force exerting device illustrating the forces produced upon rotation; and FIGS. 6, 7. 8 and 9 illustrate steps performed in using the work board holder of this invention.

DETAILED DESCRIPTION OF PREFERRED

Figure 1:
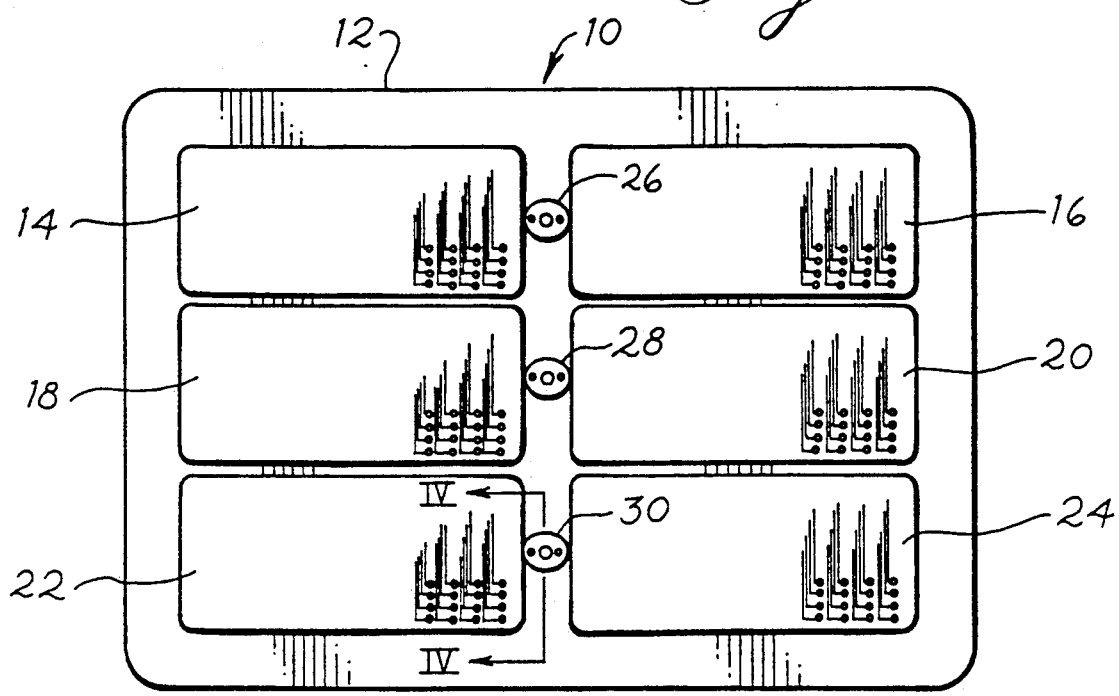
FIG. 1 is a top view of a work board holder constructed according to the teachings of this invention.

Throughout the following description, similar reference characters refer to similar elements or members in all of the figures of the drawings.

Referring now to the drawings, and to FIG. 1 in particular, there is shown a top view of a work board holder constructed according to the teachings of this invention. The work board holder 10 includes the fixture 12 which contains recessed openings in which printed circuit boards 14, 16, 18, 20, 22 and 24 are located. The printed circuit boards (PCB's) are secured in the recessed openings of the fixture 12 by the force exerting devices 26, 28 and 30 which are part of the holder 10. These devices may be activated to exert a force against the edge of the cards to lock the cards in place during the application of solder paste and components to the printed circuit boards. Of course, more or less than six printed circuit boards may be accommodated by a similar fixture without departing from the teachings of the invention.

Figure 2:
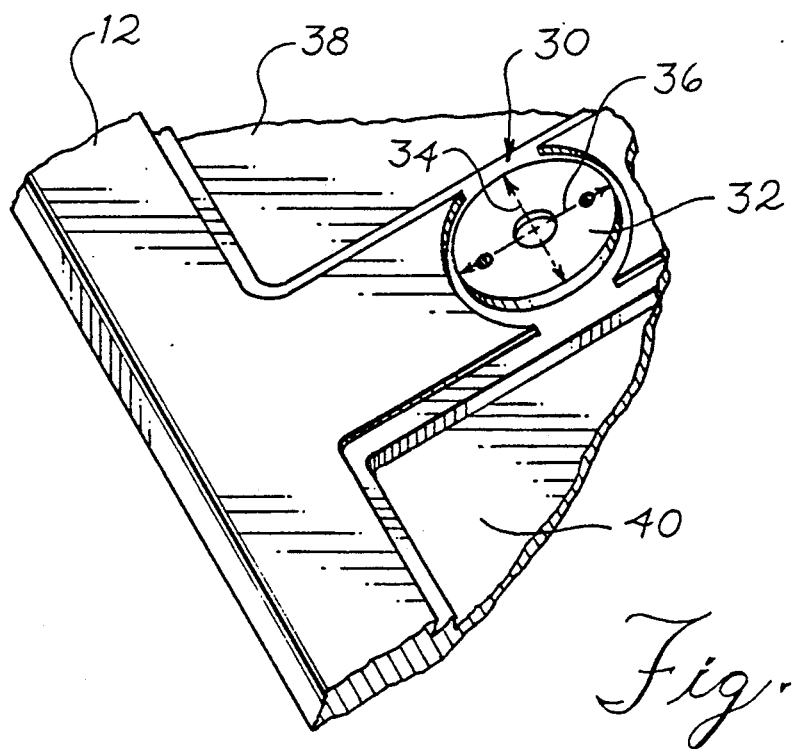
FIG. 2 is a partial, cutaway view of a work board holder showing some details of a force exerting device.

FIG. 2 is a partial view of the fixture 12 showing some details of the force exerting device 30. The force exerting device 30 includes the non-circular, elliptical, rotating member 32 which has two different size diameters, minor diameter 34 and major diameter 36. Thus, when the rotating member 32 is rotated in the fixture 12. The major diameter 36 becomes more perpendicular to the adjacent boundaries of the recessed openings 38 and 40. This causes the member 32 to exert a force against the edges of printed circuit boards which would normally be located in these openings.

Figure 3:
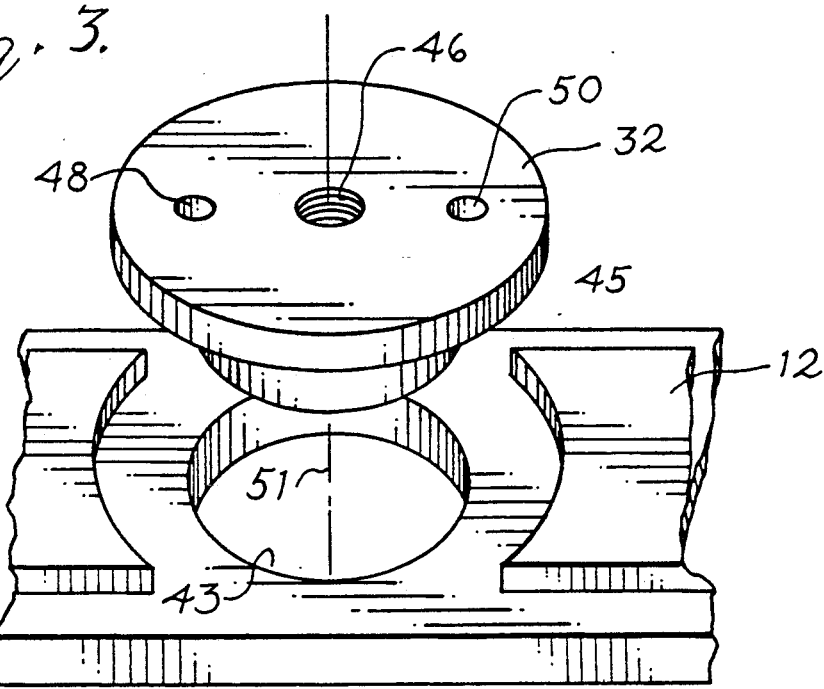
FIG. 3 is an exploded view of a force exerting device and its fixture opening.

FIG. 3 is an exploded view of a force exerting device constructed according to this invention. According to FIG. 3, the non-circular member 32 is engaged with the circular member 42 through the opening 43 of the fixture 12. Boss 45 extending from the lower portion of the member 32 is circular and is used to maintain the position of the members 32 and 42 with respect to the fixture 12. The attachment stud 44 on the circular member 42 is threaded for engagement in the threaded opening 46 of the member 32. A wrench or torquing device connected to the openings 48 and 50 in the non-circular member 32 may be used to rotate the members 32 and 42 about axis 51 for the purpose of moving the elliptical surfaces of member 32 in a direction which exerts force on the adjacent printed circuit boards.

Figure 4:
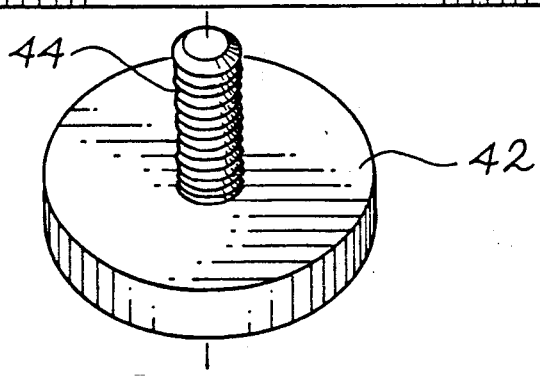
FIG. 4 is a cross-sectional view taken along line IV—IV of FIG. 1.
Figure 4:
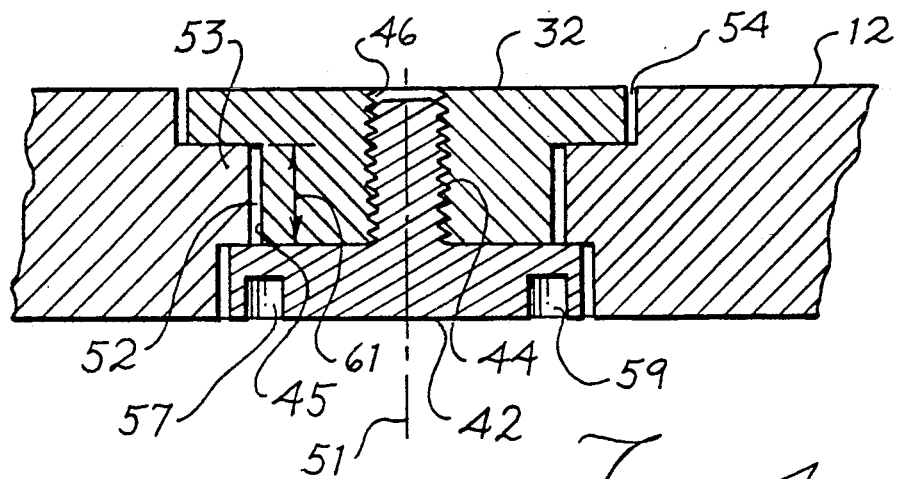

FIG. 4 is a cross-sectional view taken along line IV-IV of FIG. 1. Clearance gap 52 is provided by having the diameter of the circular boss 45 slightly smaller than the diameter of the circular opening 43 (FIG. 3). This allows for some movement of the force exerting device within the opening 43 to compensate for slight differences in the two printed circuit boards on which it exerts force. The gap 54 at the top surface of the fixture 12 also allows for some floating in the position of the force exerting device with respect to the fixture 12. The recessed openings 57 and 59 in the circular member 42 allow for tightening the two members 32 and 42 together after assembly with the fixture 12. In this specific embodiment of the invention. The length 61 of the boss 45 is slightly longer than the thickness of the protruding portion 53 of the fixture 12 which defines the opening 43. Thus, tightening the members 32 and 42 together does not tightly secure the force exerting device to the member 12. Rotation and lateral movement (floating) with respect to the fixture 12 is possible even when the members are tightened together. A thread locking compound or adhesive may be used on the threads of the attachment stud 44 to aid in securely fastening the members 32 and 42 together.

FIG. 5 is a top view of the force exerting device 30 illustrating the forces acting upon the printed circuit boards 22 and 24. When the PCB's are positioned in the fixture 12 and the member 32 is rotated in direction 56, the member 32 comes into contact with the edges of the printed circuit boards 22 and 24. This contact produces the forces 58 and 60 which are exerted against the edges 62 and 64 of the printed circuit boards 22 and 24 all respectively. In effect, rotating of the member 32 tends to make the major diameter of the elliptical surface more perpendicular to the edges 62 and 64 of the adjacent PCB's. The forces produced are co-planar, that is, acting in the same plane containing the PCB's. These forces are developed against the boards without developing any parallel force between the fixture and the force exerting device, since the device is free to float in the parallel and lateral directions co-planar with the board forces. The movement of the force exerting device is, however, restrained in a direction or dimension which is perpendicular to the plane containing the printed circuit boards.

The dimensions of the member 32 are such that, with normal variations in the dimensions of the printed circuit boards, a sufficient amount of force is provided by the device 30 before its major axis is completely perpendicular to the PCB edges. In other words, the major diameter of the member 32 is always large enough to push against the printed circuit boards when the member 32 is rotated in direction 56, regardless of the acceptable variations in the printed circuit board dimensions. However, in most cases. The forces are not in exact alignment and are displaced by the distance 63 which is a function of the diameter of the elliptical member 32, the tolerances of the printed circuit boards, and the component design dimensions. Alignment pins 65 and 67 are included in the fixture 12 and extend through openings in the printed circuit boards. These pins exert an opposite force on the printed circuit board to compensate for the force exerted by the force exerting member 30 and maintain static equilibrium. In some embodiments of the invention, the alignment pins may not be used and the counteracting forces can be provided at the other end of the printed circuit boards by the lip or border of the recessed opening in the fixture, or by other movement limiting means.

FIGS. 6, 7, 8 and 9 illustrate steps used in performing some of the operations to which the work board holder of this invention is suitable. According to FIG. 6, the PCB's 22 and 24 are loaded or inserted into the fixture or work board holder 10. For example, PCB 24 is inserted into the opening 40 of the the force exerting device 30. The wrench 66 includes protrusions which extend down into the openings 48 and 50 of the force exerting member. Turning the wrench 66 rotates the force exerting member 30 to tighten the printed circuit boards 22 and 24 within their respective openings.

According to FIG. 8, the flux or solder paste application is performed by a screening process. A suitable screen 67 is placed on top of the securely held printed circuit boards and fixture and the solder paste or flux 68 is pushed across the screen by the brush or blade 70 in direction 72. This selectively deposits the solder paste at the appropriate locations on the printed circuit boards. Because of the flush nature of the force exerting device 30, the application of the solder paste according to this invention is relatively easy and the life of the screen 67 is enhanced over the prior art methods wherein securing devices which extended above the printed circuit boards detrimentally affected the life of the screen.

After the screening process, the fixture 12 is removed from the screening apparatus or station and transported to the component placing station without removing the printed circuit boards from the fixture. As shown in FIG. 9, the locating arm 74 is used to move components, such as the surface mount component 76, to the appropriate positions on the printed circuit boards 22 and 24. During this process, the printed circuit boards continue to be held securely in the fixture 12 by the force exerting device 30. Thus, the same fixture may be used for the solder paste application and component placement processes without the need to transfer the printed circuit boards from one fixture to another.

It is emphasized that numerous changes may be made in the above-described system and apparatus without departing from the teachings of the invention. For example, instead of having a smooth elliptical shape. The non-circular member of the force exerting device may be in the shape of an elliptical polygon which provides alternating flat and pointed surfaces for pushing it against the PCB edges. It is intended that all of the matter contained in the foregoing description, or shown in the accompanying drawings, shall be interpreted as illustrative rather than limiting.

What is claimed is:

1. A work board holder for use in registering printed circuit boards during manufacturing operations involving said boards, said board holder comprising:
   a fixture containing at least two recessed openings each dimensioned to accept a printed circuit board having outside edges; and
   force exerting means located between said two recessed openings for exerting forces in opposite directions against the outside edges of each printed circuit board disposed in said openings to secure the boards in said openings;
   said force exerting means being located substantially flush with the surface of the board to provide a relatively smooth surface across the circuit board, the fixture, and the force exerting means.

2. The work board holder of claim 1 wherein the forces are exerted in directions which are generally contained with in the same plane as the plane which contains the printed circuit boards.

3. The work board holder of claim 1 wherein the force exerting means includes a non-circular member which is rotatable about an axis which is perpendicular to the plane which contains the printed circuit boards to push against said outside edges of the circuit boards.

4. The work board holder of claim 3 wherein the non-circular member has first and second diameters, with the first diameter being larger than the second diameter, and wherein the member pushes against a board edge when the member is rotated in a direction which causes the first diameter to become more perpendicular to said board edge on which the force is exerted.

5. The work board holder of claim 1 wherein the force exerting means is free to float, with respect to the fixture, in directions which are within the same plane as the printed circuit boards.

6. The work board holder of claim 5 wherein movement of the force exerting means is restrained in directions which are perpendicular to the plane containing the printed circuit boards.

7. The work board holder of claim 1 wherein the force exerting means exerts the forces against the circuit board edges without developing any parallel force between the fixture and the force exerting means.

8. The work board holder of claim 1 wherein the force exerting means includes:
   a circular member with an attachment stud perpendicularly extending from the center of the circular member;
   an elliptical member having an opening at its center adapted to receive said attachment stud; and
   means for tightly securing said stud in said opening.

9. The work board holder of claim 8 wherien a circular boss extends from one of the member, with the boss being positioned in a slightly larger circular opening in the fixture.

10. A work board holder for use in simultaneously registering a plurality of printed circuit boards during manufacturing operations involving said boards, said board holder comprising:
    a fixture containing a plurality of recessed openings each dimensioned to accept a printed circuit board having outside edges;
    a rotatable, non-circular member located between each pair grouping of the recessed openings, said member having first and second diameters with the first diameter being larger than the second diameter, and said non-circular member being positioned even with or slightly below the surface of printed circuit boards disposed in said openings to provide a relatively smooth surface across the circuit boards, the fixture, and the non-circular member; and
    means on said non-circular member to permit rotation thereof to exert oppositely directed co-planar forces on the outside edges of the adjacent circuit boards, said forces being developed when the non-circular member is rotated in a direction which causes the first diameter to become more perpendicular to said board edges on which the forces ware exerted.

11. The work board holder of claim 10 wherein the non-circular member is an elliptical member which is rotatable, about an axis which is perpendicular to the plane which contains the printed circuit boards, to make the first diameter more perpendicular o he board edges.

* * * * *